(12) United States Patent
Najda

(10) Patent No.: US 6,785,311 B1
(45) Date of Patent: Aug. 31, 2004

(54) OPTICAL SEMICONDUCTOR DEVICE

(75) Inventor: Stephen Peter Najda, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/857,936

(22) PCT Filed: Dec. 15, 1999

(86) PCT No.: PCT/JP99/07053

§ 371 (c)(1),
(2), (4) Date: Aug. 27, 2001

(87) PCT Pub. No.: WO00/36719

PCT Pub. Date: Jun. 22, 2000

(30) Foreign Application Priority Data

Dec. 15, 1998 (GB) .............................................. 9827492

(51) Int. Cl.[7] .................................................. H01S 5/00
(52) U.S. Cl. ............................. 372/45; 372/43; 372/44; 372/46; 372/47; 372/48; 372/49; 372/50; 257/18; 257/96; 257/15; 257/17; 257/22; 257/92; 257/184; 257/13; 257/190
(58) Field of Search ....................... 372/43–50; 257/18, 257/96, 15, 17, 22, 92, 184, 190, 13

(56) References Cited

U.S. PATENT DOCUMENTS

| 4,675,708 | A | | 6/1987 | Onabe | |
|---|---|---|---|---|---|
| 5,091,756 | A | * | 2/1992 | Iga et al. ....................... | 257/13 |
| 5,251,224 | A | * | 10/1993 | Irikawa et al. ................. | 372/45 |
| 5,272,712 | A | * | 12/1993 | Arimoto et al. ............... | 372/45 |
| 5,425,041 | A | | 6/1995 | Seko et al. | |
| 5,509,024 | A | | 4/1996 | Bour et al. | |
| 5,544,187 | A | * | 8/1996 | Kadoiwa et al. ............... | 372/45 |
| 5,557,627 | A | | 9/1996 | Schneider, Jr. et al. | |
| 5,991,321 | A | * | 11/1999 | Duggan ........................ | 372/45 |
| 6,084,898 | A | * | 7/2000 | Heffernan et al. ............. | 372/45 |
| 6,486,491 | B1 | * | 11/2002 | Najda ........................... | 257/18 |

FOREIGN PATENT DOCUMENTS

| EP | 0 549 103 | 9/1992 |
|---|---|---|
| EP | 0 849 848 | 12/1997 |
| WO | 97/40560 | 10/1997 |

OTHER PUBLICATIONS

Morrison et al.: "Simple effective mass model to include the effects of Gamma–X mixing in multiquantum barriers" Optical Engineering, Dec., 1994, USA, vol. 33, No. 12, pp. 3926–3930 (Copy To Be Provided.

Short Wavelength INGaAIP Visible Laser Diodes' IEEE Journal of Quantum Electronics vol. 27, No. 6, Jun. 1991, (New York) Gen–ichi Hatakoshi et al., pp. 1476–1482 (Copy To Be Provided).

International Search Report regarding International Application No. PCT/JP99/07053 dated Dec. 15, 1999.

* cited by examiner

Primary Examiner—Don Wong
Assistant Examiner—Delma R. Flores Ruiz
(74) Attorney, Agent, or Firm—Renner, Otto, Boisselle & Sklar, LLP

(57) ABSTRACT

An optical semiconductor device comprising: an active region; and a p-doped cladding region disposed on one side of the active region; wherein an electron-reflecting barrier is provided on the p-side of the active region for reflecting both Γ-electrons and X-electrons, the electron-reflecting barrier providing a greater potential barrier to Γ-electrons than the p-doped cladding region.

23 Claims, 11 Drawing Sheets

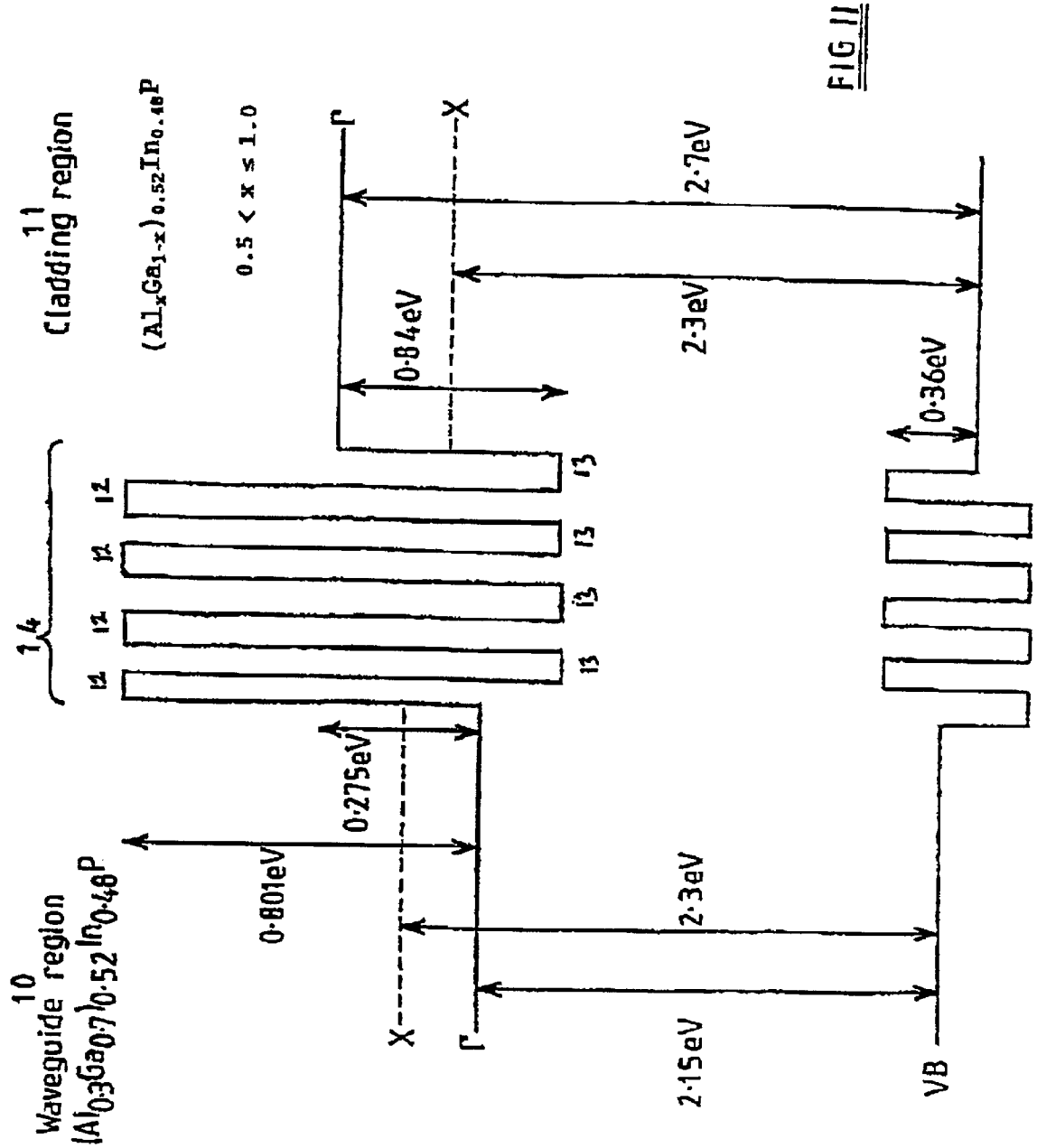

OPTICAL SEMICONDUCTOR DEVICE

DESCRIPTION

1. Technical Field

This invention relates to an optical semiconductor device and particularly, but not exclusively, to a semiconductor laser device that emits variable radiation in the wavelength range 630 nm to 680 nm. The laser device may be of the edge-emitting or of the surface-emitting type.

2. Background Art

Laser devices or laser diodes (LDs) fabricated in the (Al,Ga,In)P material system which emit visible light in the 630 nm–680 nm wavelength range are becoming increasingly important components of professional and consumer products. For example, it is envisaged that the Digital Video Disc (DVD) system will enjoy a 635 nm–650 nm wavelength LD capable of delivering up to 30 mW output power up to a temperature of 60° C. The next generation of semiconductor lasers will need an even greater maximum power output up to a higher (eg. 70° C.) operating temperature.

By the (Al,Ga,In)P system is meant the family of compounds having the general formula $(Al_xGa_{1-x})_{1-y}In_yP$, where both x and y are between 0 and 1. One particular advantage of this semiconductor system is that it is lattice-matched to a GaAs substrate when the indium mole fraction, y, is equal to 0.48.

A principal limitation of current (Al,Ga,In)P laser diodes is that they are incapable of operating for long periods (or with a sufficiently low threshold current) at the highest specified operating temperature. It is generally believed that this is caused by electron leakage from the active region of the device into the surrounding optical guiding region and subsequently into the p-type cladding region.

One type of laser device is the separate confinement heterostructure laser. The generic structure of a separate confinement laser structure intended to generate light at 630–680 nm will now be described with reference to FIGS. 1 and 2.

Curve (a) of FIG. 1 illustrates the difference between the Γ-conduction band energy of $(Al_xGa_{1-x})_{0.82}In_{0.48}P$ and $Ga_{0.52}In_{0.48}P$, as a function of the aluminium mole fraction in the quaternary alloy. Curves (b) and (c) of FIG. 1 show the difference between the X-conduction band energy and the Γ-valance band energy respectively. FIG. 1 assumes that the bandgap difference between (Al,Ga)InP and GaInP is split in a ratio of 70:30 between the conduction band offset and the valance band offset.

It will be seen that the minimum energy in the conduction band of (Al,Ga,In)P is a function of the aluminium content. There is a crossover from a Γ-band minimum to an X-band minimum at an aluminium concentration of about 0.55.

The terms Γ-band and X-band as used herein refer to symmetry points in the Brillouin zone and are standard terms in solid state physics, see for example R. A. Smith "Semiconductors", (Cambridge University Press, 1978). The terms Γ-minimum and X-minimum refer to the minimum energy level of the Γ-band and the X-band, respectively.

FIG. 2 is a schematic band structure of a separate confinement laser structure fabricated in the (Al,Ga,In)P system. It consists of an n-doped $(Al_{0.7}Ga_{0.3})_{0.52}In_{0.48}P$ cladding region 1, an $(Al_{0.5}Ga_{0.5})_{0.52}In_{0.48}P$ optical guiding region 2, 4, a GaInP quantum well active region 3 disposed within the $(Al_{0.8}Ga_{0.5})_{0.52}In_{0.48}P$ optical guiding region, and a p-doped $(Al_{0.7}Ga_{0.2})_{0.52}In_{0.48}P$ cladding regions. Optical transitions giving rise to laser action in the quantum well active region 3 of the laser diode originate from Γ-electrons in the GaInP quantum well active region.

The electron leakage current consists of that fraction of the electrons which have sufficient thermal energy to surmount the potential barrier on the right hand side of FIG. 2, and pass into the p-doped cladding region 5. It will be seen that Γ-electrons are confined in the optical guiding region (waveguide region) by a potential barrier of only around 90 meV at the interface with the p-doped cladding region. This relatively small barrier height allows a significant proportion of electrons to escape. Moreover, holes in the valence band are confined only by a potential barrier of around 50 meV, and this low barrier height also allows significant carrier escape. Furthermore the X-conduction band in the p-cladding region 5 is some 50 meV below the Γ-cladding band in the waveguiding region 2, 4, and this allows electrons to escape from the wavelength region 2, 4 through the X-states in the p-doped cladding regions. Thus, the laser illustrated in FIG. 2 has a high leakage current, and so has poor performance at high temperatures.

P. M. Smowton et al. in "Applied Physics Letters" Vol. 67, pp. 1265–1267 (1995) show that an important leakage mechanism for electrons can be via the indirect X-valley of the conduction bands in the p-side guiding and cladding regions of a separate confinement hetero-structure laser having two $Ga_{0.41}In_{0.59}P$ quantum wells separated by a barrier, or set in an optical guiding region of $(Al_yGa_{1-y})_{0.51}In_{0.49}P$ (where y is variously 0.3, 0.4 and 0.5), and clad with $(Al_{0.7}Ga_{0.3})_{0.51}In_{0.49}P$ cladding regions, doped with Zn on the p-side and Si on the n-side. However, no proposals are made for mitigating the problems caused by loss of electrons via this mechanism.

There have been a number of proposals to improve the temperature performance of laser devices fabricated in the (Al,Ga,In)P system.

T. Takagi et al., "IEEE Journal of Quantum Electronics)" Vol. 27, No. 6, 1511 (1991) have proposed introducing a multiple-quantum well barrier in the cladding region.

In UK Patent Application No. 9526631.8, it is proposed that the insertion of a δ-doped p-type layer in the p-doped cladding region of a SCH laser diode will have the effect of increasing the band bending on the p-side of the heterojunction and thus increase the potential barrier which is presented to thermal leakage of electrons.

G. Hatakoshi et al., "IEEE Journal of Quantum Electronics, Vol. 27, p1476 (1991) have proposed increasing the doping level of the p-doped cladding region in order to increase the potential barrier between the waveguiding region and the p-doped cladding region. UK Patent Application No. 9626644.0 discloses a semiconductor laser which incorporates an electron reflecting layer, to prevent X-electrons escaping into the p-doped cladding region. UK Patent Application No. 9626657.2 discloses the use of electron capture layers to capture X-electrons, and transfer them to a Γ-confined energy level in the active region. However, the affectiveness of these schemes to improve the temperature characteristics of an (Al,Ga,In)P laser device is currently unclear.

The principle of operation of a multiple quantum well barrier (MQB) is to incorporate an MQB in the p-type cladding region of an SCH laser device. The MQB consists of very thin alternating layers of, for example, (In,Ga,)P and (Al,Ga,In)P (for an (Al,Ga,In)P laser). An electron which has sufficient thermal energy to escape from the SCH structure will be quantum mechanically reflected at each of the interfaces of the MQB. If the layer thicknesses are chosen to be $\lambda/4$ in thickness, where $\lambda$ is the electron wavelength, then a band of energies can be engineered at which electrons will be reflected with a probability of 1. Almost unity reflectivity of the electrons can be engineered to exist well above the classical barrier height. Theoretically, a MQB can increase the effective barrier height by up to a factor of 2 compared to the classical barrier height.

K. Kishino et al. "Applied Physics Letters" Vol. 58, pp. 1822–1824 (1991) and H. Hamada et al "Electronics Letters" Vol. 28, pp 1834–1836 (1992) provide evidence to show that the temperature dependence of the threshold current of shot wavelength lasers is improved through the use of such reflectors. However, the effectiveness of the reflectors is usually inferred from LD operating characteristics rather than from a direct measurement of the enhancement of the barrier height. It is difficult to quantify, therefore, just what advantage has accrued from the use of a MQB in comparison to any advantage that might have occurred simply due to better processing or better medical quality. Furthermore, it should be noted that the effectiveness of the MQB is realised only if the coherence length of the electrons is long. Anything which destroys this coherence such as, for example, interface scattering, will significantly diminish the reflectivity properties.

Increasing the doping level of the p-doped cladding layer will increase the potential barrier between the waveguiding region 4 and the p-doped cladding region 5. However, there are practical limitations to the amount of p-doping which can be incorporated into (Al,Ga,In)P or (Al,In)P cladding regions. This is particularly true of MOCVD grown materials, where a maximum impurity concentration of approximately $2\times10^{18}$cm$^{-3}$ can be achieved using either Zn or Mg. An example of this is given by D. P. Bour et al. in "IEEE Journal of Quantum Electronics" Vol. 30, pp. 593–606 (1994). However, any further increase in the dopant concentration using this technique causes the dopant to diffuse into the active region of the device, thereby degrading its performance.

It is possible to increase the aluminium content of the cladding layer 5 in order to increase the potential barrier between the waveguiding region 4 and the p-doped cladding region 5, and thereby increase the $\Gamma$-electron and valence band hole confinement. This approach is illustrated in FIG. 3. This illustrates an SCH laser structure that is similar to that shown in FIG. 2, but in which the cladding regions 1,5 are formed of AlInP. The potential barrier between the optical guiding region 4 and the p-doped cladding region 5 is now 250 meV, and the potential barrier confining the valence band holes is now 100 meV. Thus, the laser structure shown in FIG. 3 will have improved carrier confinement compared to the structure shown in FIG. 2.

Increasing the aluminium content of the cladding layers 1,5 will not, however, prevent carrier escape via the X-band states in the p-doped cladding region 5.

DISCLOSURE OF THE INVENTION

A first aspect of the present invention provides an optical semiconductor device including: an active region; and a p-doped cladding region disposed on one side of the active region; wherein an electron-reflecting barrier is provided at the p-side of the active region for reflecting $\Gamma$-electrons and X-electrons, the electron-reflecting barrier providing a greater potential barrier to $\Gamma$-electrons than the p-doped cladding region.

S. J. Chang et al., "IEEE Photonics Technology Letters" Vol. 10, No. 5, p651 (1998) describes in (Al,Ga,In)P laser diode having an emission wavelength of 624 nm. The laser diode is provided with a triple tensile strain barrier cladding layer to introduce a barrier to $\Gamma$-electrons. Improved temperature dependence is observed. However, the tensile reflective layers do not provide any barrier to X-electrons. On the contrary, they introduce quantum wells for trapping X-electrons. Thus, significant carrier loss via the X-band states in the p-doped cladding region still occur with this structure.

U.S. Pat. No. 5,509,024 discloses a laser diode having a tunnel barrier layer. An AlAs barrier layer is introduced between the optical guiding region and the p-doped cladding region to act as a barrier to $\Gamma$-electrons.

U.S. Pat. No. 5,509,204 does not address the problem of carrier loss via the X-states in the p-doped cladding region. The patent proposes locating the AlAs barrier layer between a $(Al_{0.5}Ga_{0.5})_{0.52}In_{0.48}P$ optical guiding region and a $(Al_{0.7}Ga_{0.3})_{0.52}In_{0.48}P$ cladding region. At the date of this patent, neither the band offsets not the $\Gamma$-X direct-indirect bandgap changeover in the (Al,Ga,In)P system were well established. In the light of recent experimental evidence concerning the $\Gamma$-X direct-indirect bandgap changeover, it can be seen that the structure proposed in U.S. Pat. No. 5,509,024 will introduce a 0.32 eV trapping quantum well for X-electrons. Thus, while the scheme proposed in this patent will introduce a potential barrier of around 0.58 eV for $\Gamma$-electrons, it will not address the problem of carrier loss via the X-states in the p-doped cladding region. Indeed, the introduction of the 0.32 eV quantum well for X-electrons will aggravate this problem.

In contrast to the above prior art, however, the present invention provides a barrier that will prevent leakage of both $\Gamma$-electrons and X-electrons. The problem of carrier loss via the X-states in the p-doped cladding region is prevented, or at least significantly reduced, since the electron-reflecting barrier reflects X-electrons as well as $\Gamma$-electrons.

The electron-reflecting barrier may include a first electron-reflecting layer for reflecting $\Gamma$-electrons and a second electron-reflecting layer for reflecting X-electrons. This is a convenient way of providing a barrier for both $\Gamma$-electrons and X-electrons.

At least one of the electron-reflecting layers may be a strained layer. In some cases, a strained semiconductor layer has a forbidden bandgap that is greater than the forbidden bandgap of the bulk semiconductor material, and using such a strained layer as an electro-reflecting layer will increase the potential barrier to electron and hole leakage.

One of the electron-reflecting layers may be in a state of compressive strain and the other of the electron-reflecting layers may be in a state of tensile strain. The two electron-reflecting layers will thus form a strain-compensated barrier. It has been reported that a strain-compensated barrier can be made thicker than the sum of the critical thicknesses of the individual layers without introducing defects into the layers. This means that a strain compensated electron-reflecting barrier can be made thicker without introducing defects, and a thicker barrier will reflect more electrons back into the active region thereby improving the confinement of the electrons.

The device may be a light-emitting diode, or it may be a laser device. The laser device may be a separate confinement heterostructure laser device including an optical guiding region, the active region being disposed within the optical guiding region. The layer for reflecting $\Gamma$-electrons may be disposed between the optical guiding region and the layer for reflecting X-electrons. The Γ-conduction band of the optical guiding region may be substantially degenerate with the X-conduction band of the layer for reflecting Γ-electrons. This ensures that the layer for reflecting Γ-electrons does not produce a quantum well for X-electrons.

Alternatively, the layer for reflecting Γ-electrons may be disposed between the layer for reflecting X-electrons and the p-doped cladding region. In this arrangement, the formation of a quantum well for X-electrons in the layer for reflecting Γ-electrons does not cause a serious problem, since few X-electrons reach the layer for reflecting Γ-electrons. This arrangement therefore allows a wider choice of materials for the optical guiding region.

The electron-reflecting barrier may include a plurality of first electron-reflecting layers for reflecting Γ-electrons and a plurality of second electron-reflecting layers for reflecting X-electrons. The electron reflecting barrier may be a superlattice structure. This is possible because the electron barrier is strain compensated.

The divide may be fabricated in the (Al,Ga,In)P system, the or each layer for reflecting Γ-electrons may be AlP or GaP, and the or each layer for reflecting X-electrons may be InP. This provides a convenient way of reducing the leakage current in an (Al,Ga,In)P laser.

The layer for reflecting Γ-electrons may be AlP and the optical guiding region may be $(Al_{0.9}Ga_{0.7})_{0.52}In_{0.48}P$. This makes the Γ-conduction band of the optical guiding region substantially degenerate with the x-conduction band of the layer for reflecting Γ-electrons, as is preferable when the layer for reflecting Γ-electrons is disposed between the optical guiding region and the layer for reflecting X-electrons.

The thickness of each of the electron-reflecting layers may be 16A or less. The this thickness is lower than the critical thickness at which the formation of misfit dislocations in a strained layer becomes energetically favourable.

At least one of the electron-reflecting layers may be p-doped. If the electron-reflecting layers are heavily p-doped band banding will occur, and this will increase the height of the potential barrier to electron transport into the p-cladding region. The p-doping will also reduce the barrier height for hole transport into the optical guiding region.

The first electron-reflecting layer, or at least one of the first electron-reflecting layers (if there are more than one), may contain indium. Introducing indium into an AlP or GaP strained layer will reduce the strain in the layer, and will hence increase the critical thickness of the layer. The layer(s) for reflecting Γ-electrons can therefore be made thicker, and this will reduce the probability that electrons can tunnel through the layer.

The electron-reflecting barrier may be disposed between the optical guiding region and the p-doped cladding region.

A second aspect of the present invention provides an optical semiconductor device including: an optical guiding region; an active region having at least one energy well, said active region being disposed in said optical guiding region; and n-doped and p-doped cladding regions disposed on opposite sides of the optical guiding region; wherein an electron-reflecting layer for reflecting Γ-electrons is disposed at the p-side of the active region; and wherein the Γ-conduction band of the optical guiding region is substantially degenerate with the X-conduction band of the electron-reflecting layer.

This aspect of the present invention addresses the problem outlined above with reference to the lasers described in S. J. Chang et al. and in U.S. Pat. No. 5,509,024. In this aspect, the X-conduction band of the electron reflecting layer is chosen to be substantially degenerate with the Γ-conduction band of the optical guiding region. This prevents the formation of a quantum well for X-electrons in the layer for reflecting Γ-electrons. This can be done, for example, by selecting the composition of the optical waveguiding region appropriately.

WO 97/40560 discloses an (Al,Ga,In)P light emitting diode. An AlP barrier layer is disposed between the active region and the p-type cladding region of the LED. However, while this barrier layer will increase confinement for Γ-electrons, a quantum well will be produced in the X-conduction band. The depth of this quantum well will be approximately 0.4 eV and, as explained above, introduction of this quantum well will aggravate the problem of the loss of electrons via the X-states in the p-doped cladding region of the LED.

The optical guiding region may be formed of $(Al_{0.3}Ga_{0.7})_{0.52}In_{0.48}P$, and the electron-reflecting layer may be formed of AlP. This is a convenient way of putting the second aspect of this invention into practice in the (Al,Ga,In)P system.

The electron-reflecting layer may be p-doped.

The electron-reflecting layer may be disposed between the optical guiding region and the p-doped cladding region.

The device may be a separate confinement heterostructure laser device.

BRIEF DESCRIPTION OF THE DRAWINGS

Preferred embodiments of the present invention will now be described in detail by way of illustrative examples with reference to the accompanying Figures in which:

FIG. 11 shows the partial schematic band structure of another embodiment of the invention.

BEST MODE FOR CARRYING OUT THE INVENTION

Figure 4:
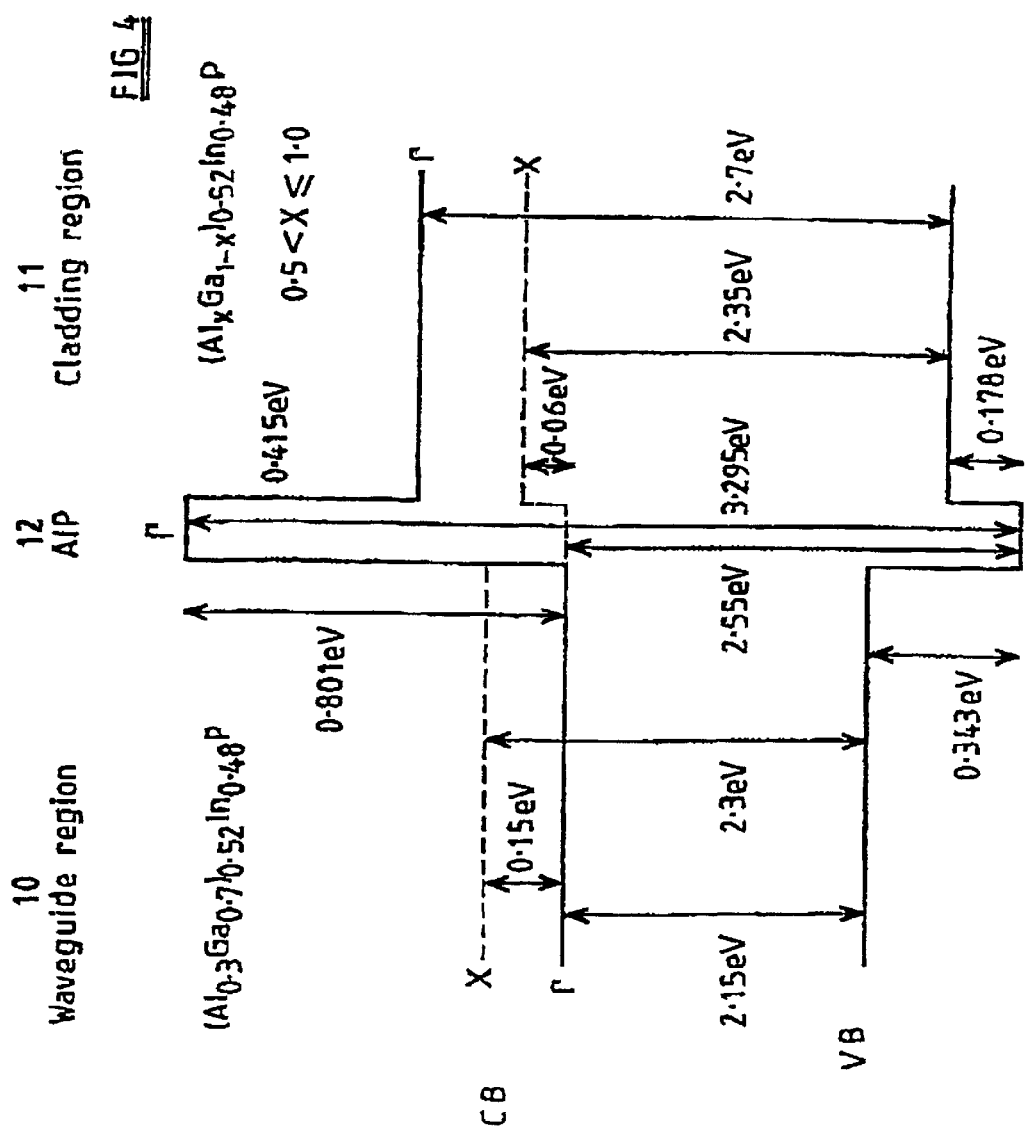
FIG. 4 is a partial, schematic band diagram of an SCH laser according to a first embodiment of the present invention.

FIG. 4 is a partial, schematic illustration of the band structure of a first embodiment of the invention. This shows the band structure of the optical guiding region 10 (or waveguide region) and the p-doped cladding region 11 of an SCH laser device. The optical guiding region 10 is disposed between the p-type cladding region 11 and an n-type cladding region (not shown in FIG. 4). An active region (not shown) having at least one energy well for providing laser oscillation is disposed within the optical guiding region 10.

The embodiment of FIG. 4 is fabricated in the (Al,Ga,In)P system. The optical guiding region 10 is formed of $(Al_{0.3}Ga_{0.7})_{0.52}In_{0.48}P$. The cladding region is formed of $(Al_xGa_{1-x})_{0.52}In_{0.48}P$, where $0.5<x\leq1.0$. In the embodiment of FIG. 4, x is chosen to be 1 so that the cladding layer 11 is formed of $Al_{0.52}In_{0.48}P$, and the band energies shown in FIG. 4 are for an $Al_{0.52}In_{0.48}P$ p-type cladding region. An electron-reflecting layer 12, formed of AlP, is disposed between the optical guiding region 10 and the p-doped cladding region 11.

The lattice constant for AlP is 5.46Å, whereas the lattice constant of the optical guiding region 10 will be 5.653Å. (As noted above, (Al,Ga,In)P having an indium mole fraction of 0.48 is lattice matched to GaAs, so that the lattice constant of the optical guiding region will be equal to the lattice constant of GaAs.) The lattice constant of the cladding region 11 will also be 5.653Å since the cladding region has an indium mole fraction of 0.48. Thus, the lattice mismatch between the electron-reflecting layer 12 and the optical guiding region 10 is approximately 3.4%.

In general, dislocations would occur at an interface between two semiconductor materials having a lattice mismatch of 3.4%. This is undesirable in the present case, since these dislocations and defects would degrade the properties of the laser device.

It is well known that if the lattice mismatch between an underlying layer and a growing epilayer is sufficiently small, the first atomic layers which are deposited will be strained to match the lattice constant of the underlying layer so that a coherent interface will be formed. However, as the thickness of the growing epilayer increases, the homogeneous strain energy increases until a critical thickness is reached at which it becomes energetically favourable for misfit dislocations to be introduced. The existence of this critical thickness was first disclosed in J. H. Van der Merwe "Journal of Applied Physics" Vol. 34, page 123 (1962). It is preferable that the thickness of the electron reflecting layer 12 is lower than the critical thickness, to prevent dislocations occurring. In this case, the electron-reflecting layer will be in a strained state. In this embodiment it will be in a state of tensile strain, since AlP has a lower lattice constant than the waveguiding region 10.

For a lattice mismatch of 3.4%, the critical thickness at which misfit dislocations will occur is estimated to be 16Å, see R. People et al., "Applied Physics Letters" Vol. 47 No. 3 pp. 322–324 (1985). In the embodiment of FIG. 4, therefore, the thickness of the electron reflecting layer 12 is preferably 16Å or less.

In bulk AlP, the $\Gamma$-$\Gamma$ bandgap is 3.6 eV, and the $\Gamma$-X bandgap is 2.5 eV. In the embodiment of FIG. 4, however the AlP layer 12 is under tensile strain and this will reduce the bandgap from the bulk value of 3.6 eV. The bandgap will be reduced to 3.295 eV for the light hole and 3.5 eV for the heavy hole valence band. The reduction in bandgap of a strained layer is described in, for example, Chin-Yu Yeh et al, "Physical Review B" Vol. 50, No. 4, pp 2715–2718 (1994). Assuming a 70:30 band offset, the AlP electron reflecting layer therefore introduce a 0.801 eV barrier to the transport of $\Gamma$-electrons into the p-doped cladding region 11 (this calculation uses the light-hole bandgap). The X-band in the optical guiding region 10 is 0.15 eV above the $\Gamma$-band, so that most electrons in the optical guiding region will be in the $\Gamma$-band. These $\Gamma$-electrons will be reflected back into the active region by the electron reflecting layer 12. A simple calculation of the transmission of an electron through a rectangular barrier indicates that only approximately 6% of $\Gamma$-electrons would be transmitted through the bottom of a 0.801 eV potential barrier having a thickness of 16Å (this calculation assumes that the effective mass of the $\Gamma$-electrons is $m_c \approx 0.15$). In practice, the electron transmission through the electron-reflecting layer in FIG. 4 is probably less than 6%, owing to the presence of the thick p-doped cladding region 11 adjacent to the electron reflecting layer. The p-doped cladding region 11 is formed of $(Al_xGa_{1-x})_{0.52}In_{0.48}P$, where $0.5<x\leq1.0$, and will have a $\Gamma$-$\Gamma$ bandgap of up to 2.7 eV. The transmission through the AlP layer increases to approximately 13% at an energy degenerate with the $\Gamma$-band in the cladding region.

The light hole is reduced in energy compared to the heavy hole valence band in the AlP layer 12, because the layer is under tensile strain. The conduction band-light hole bandgap is 3.294 eV, and this will give a potential barrier for light holes of 0.178 eV. There is an approximately 26% probability of holes tunnelling through this barrier into the optical guiding region 10.

The conduction band—heavy hole bandgap in the AlP layer 12 is 3.497 eV, producing a 0.239 eV barrier to heavy holes (the heavy hole barrier is not shown in FIG. 4).

(It should be noted that the value of the $\Gamma$-$\Gamma$ bandgap in AlP may be larger (4.4 eV) than the value given above, as suggested by Chin-Yu Yeh et al., and that the band offset for compressively strained layers may be 85:15 rather than 70:30, as suggested by M. D. Dawson et al, "Applied Physics Letters", Vol 64 (7) p 892 (1994). Both these effects would tend to increase the potential barrier set up in FIG. 4.)

In the embodiment shown in FIG. 4, the aluminum concentration in the optical waveguiding region has been selected so that the $\Gamma$-band in the optical guiding region 10 is degenerate with the X-band in the AlP layer 12. This prevents a quantum well for X-electrons forming in the AlP layer, and thus overcomes the problems identified above with the devices proposed by Chang et al and U.S. Pat. No. 5,509,024.

Furthermore, for an AlInP cladding region, the X-band of the p-doped cladding region 11 in FIG. 4 is 0.06 eV higher than the X-band in the AlP layer 12 (if the cladding region has a lower aluminum mole fraction, the X-band potential will be lower). The few X-electrons in the optical guiding region 10 will thus face a 0.06 eV potential barrier to transport into the p-doped cladding region, and this will tend to confine them within the waveguiding region. It can thus be seen that the structure illustrated in FIG. 4 provides a barrier for both $\Gamma$-electrons and X-electrons. The AlP layer 12 provides a greater potential barrier to $\Gamma$-electrons than does the p-type cladding layer 11.

Figure 3:
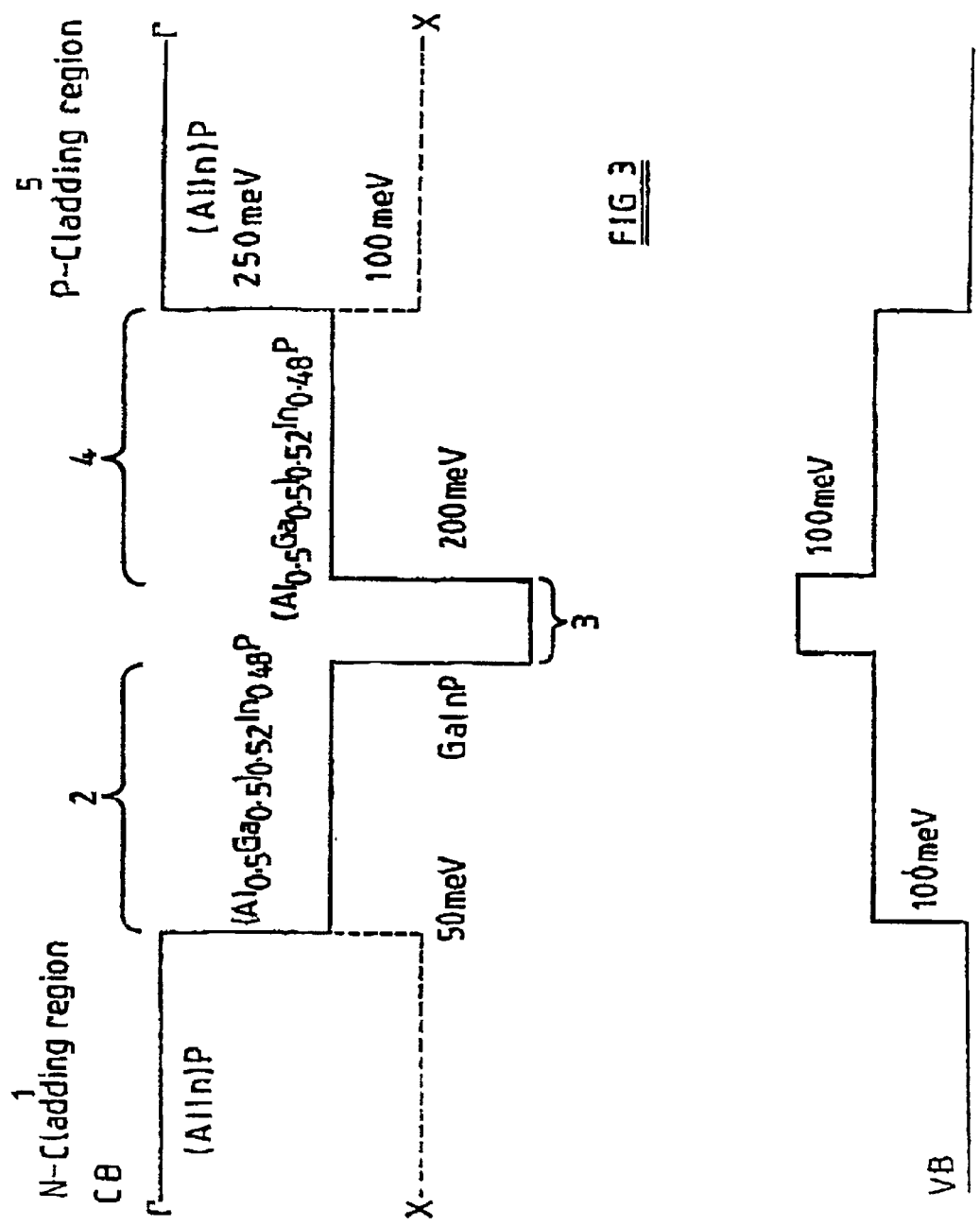
FIG. 3 is a schematic band structure diagram of a SCH laser similar to that shown in FIG. 2, but in which the cladding layer are formed of (Al,In)P.

In contrast, in the conventional structure illustrated in FIG. 3, the X-conduction band in the p-doped cladding region is lower than the X-band in the optical guiding region. In the conventional structure, therefore, there is no potential barrier preventing X-electrons passing from the optical guiding region into the cladding region.

Figure 5:
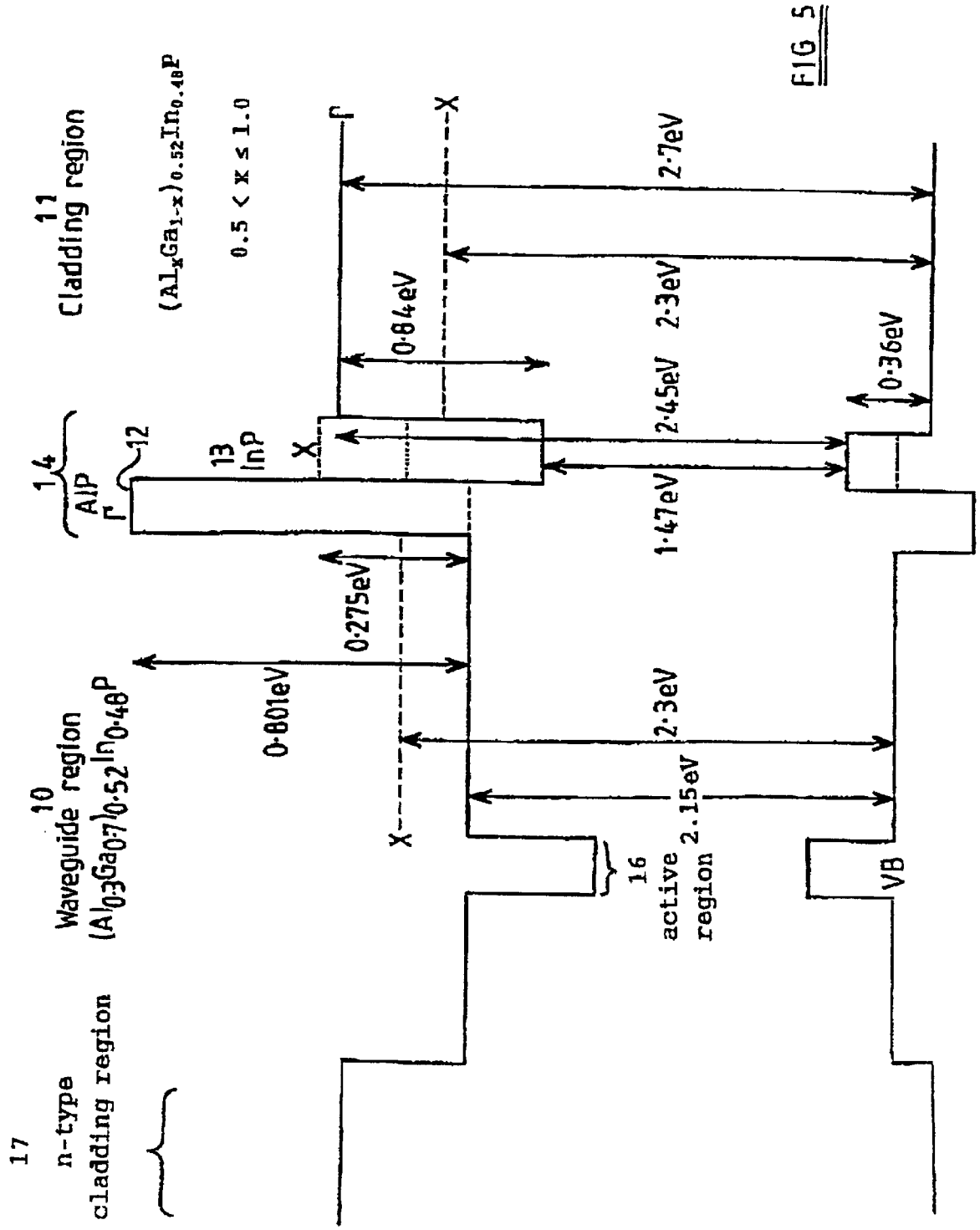
FIG. 5 is a schematic diagram of the band structure of the optical guiding region and p-type cladding region of an SCH laser device containing an electron reflecting barrier layer according to a further embodiment of the present invention.

A further embodiment of the invention is illustrated in FIG. 5. This figure again shows the bandgap structure of an SCH laser device fabricated in the (Al,Ga,In)P system lattice matched to GaAs. The p-type cladding region 11 is formed of $(Al_xGa_{1-x})_{0.52}In_{0.48}P$ where $0.5<x\leq1.0$, and preferably $0.7<x\leq1.0$. In the embodiment shown in FIG. 5 x is chosen to be 1.0, and the band energies shown in FIGS. 5 and 9 relate to an $Al_{0.52}In_{0.48}P$ cladding layer. The active region 16 and the n-type cladding region 17 of the laser device are shown schematically in FIG. 5. The precise nature and composition of the active region 16 and the n-type cladding region 17 are not relevant to the invention, and will not be described further.

In this embodiment, a strain compensated barrier layer 14 is placed at the interface between the waveguiding region and the p-doped cladding region. The strain compensated barrier layer consists of an AlP layer 12 and an InP layer 13. The barrier layer 14 provides a potential barrier for both Γ-electrons and X-electrons.

The AlP layer 12 and the InP layer 13 are both selected to have a thickness less than the critical thickness, to prevent misfit dislocations occurring. The AlP layer 12 ad the InP layer 13 are therefore both under strain. As noted above, in connection with FIG. 4, the AlP layer 12 is in a state of tensile strain since its lattice constant is approximately 3.4% lower than the lattice constant of the optical guiding region 10 (which is lattice matched to GaAs and so has a lattice constant of 5.653Å). The InP layer however, is in a state of compressive strain, since its lattice constant is approximately 3.8% greater than the lattice constant of the optical guiding region 10.

For the case of a layer in a state of compressive strain, the Γ-bandgap increases whereas the X-bandgap decreases. The valence band degeneracy is split, with the heavy hole band being at a lower energy than the light hole band.

As noted above with reference to FIG. 4, the AlP layer 12 provides a potential barrier of 0.801 eV to Γ-electrons in the optical guiding region 10.

The thickness of the InP layer is chosen such that the first confined state in the InP layer lies above the X-band in the p-doped cladding region 11, and also lies above the X-band in the AlP layer 12. The InP layer thus acts as an additional electron reflecting layer to electrons that manage to pass through the AlP layer. It provides a 0.275 eV potential barrier to X-electrons in the optical guiding region 10. The InP layer 13 thus prevents the loss of electrons from the optical guiding region 10 via X-states in the cladding region 11.

It is preferred that the aluminum content of the optical guiding region 10 is selected such that the Γ-band in the optical guiding region 10 is degenerate with the X-band in the AlP layer 12, in order to prevent a quantum well for X-electrons being set up in the AlP layer 12. To achieve this, the optical guiding region is preferably formed of $(Al_{0.3}Ga_{0.7})_{0.52}In_{0.48}P$.

Figure 9:
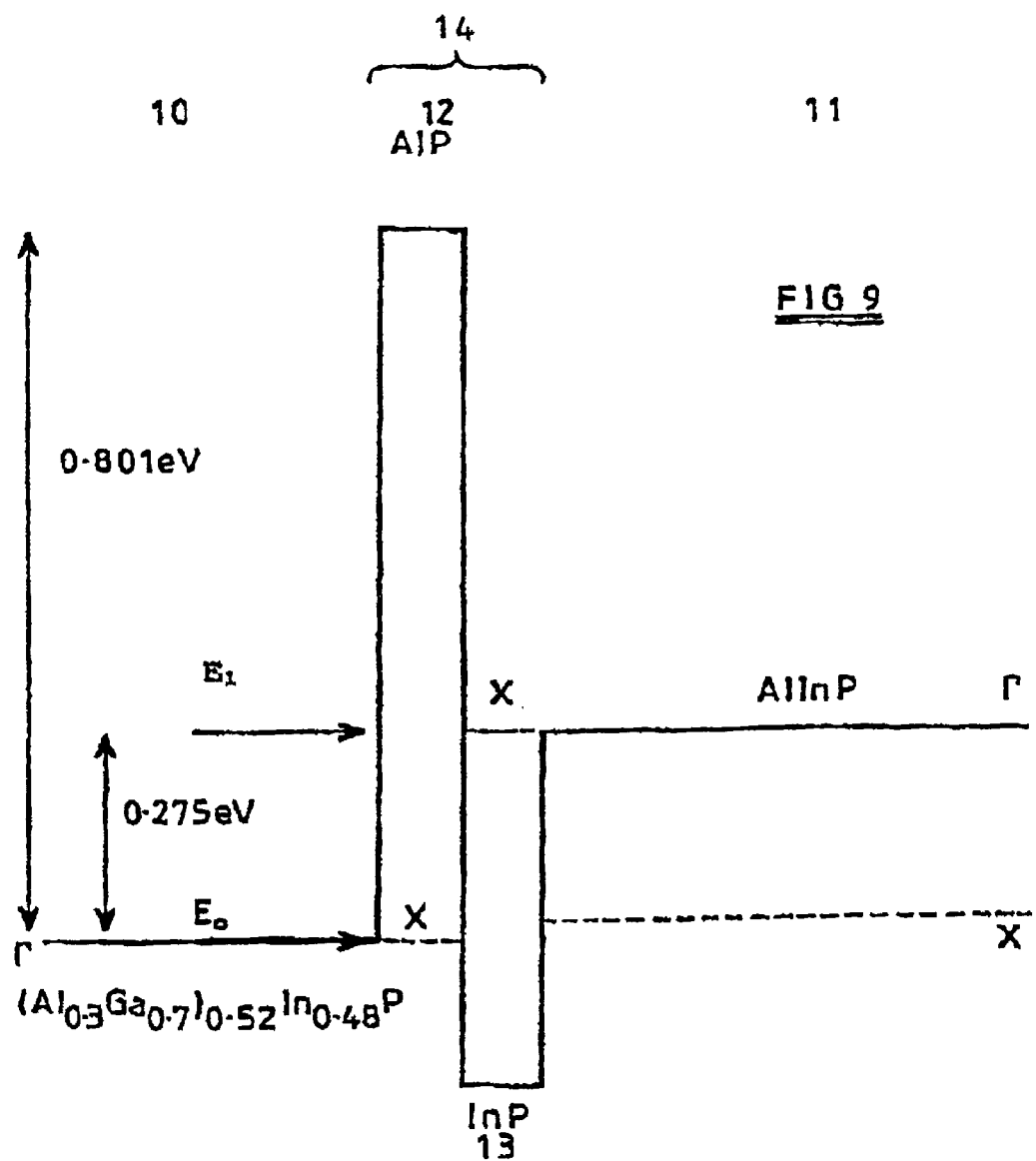
FIG. 9 is a partial view of the conduction band of FIG. 5.

FIG. 9 illustrates the conduction band of the optical guiding region and the p-type cladding region of the structure of FIG. 5.

Γ-electrons having an energy $E_0$-that is, which are at the conduction band energy of the optical guiding region 10 will encounter an 0.801 eV potential barrier which has a thickness of 16Å. As noted above with reference to FIG. 4, only around 6% of Γ electrons will be transmitted through the bottom of such a barrier (assuming an effective mass $m_0$=0.15). (In reality, there will be almost no Γ-electron loss at the conduction band energy of the optical guiding region, due to the presence of the thick p-doped cladding region 11.)

X-electrons having an energy $E_0$ face a 0.275 eV potential barrier provided by the InP layer 14. Approximately 6% of X-electrons having an energy $E_0$ will be transmitted through this barrier, assuming an effective mass $m_0$=0.45.

Figure 2:
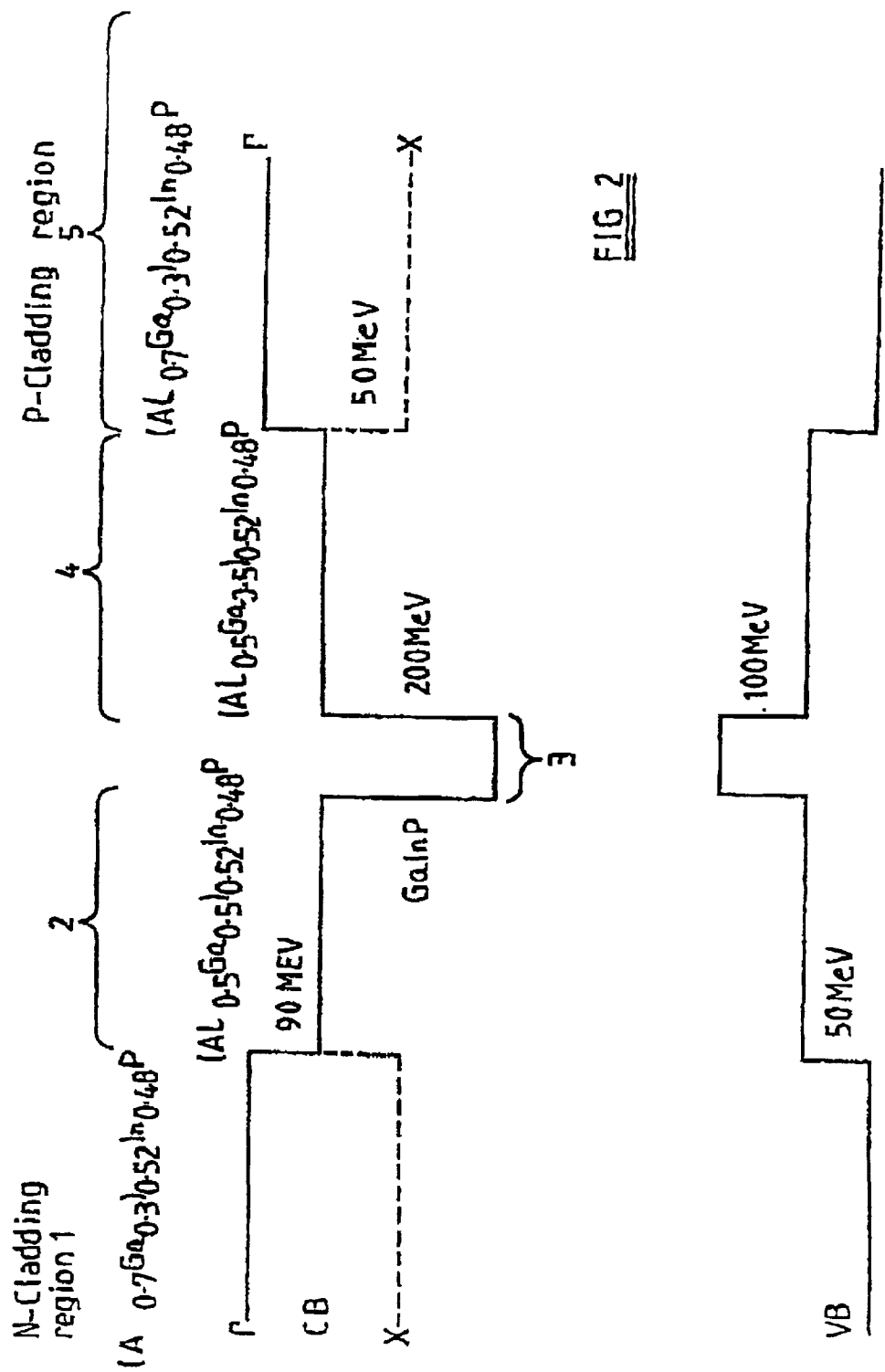
FIG. 2 is a schematic band structure diagram of a separate confinement heterostructure semiconductor laser fabricated in the (Al,Ga,In)P system.

The energy $E_1$ shown in FIG. 9 is equal to the Γ-band of the p-type cladding region 11. In a conventional SCH laser structure, such as that shown in FIG. 2 for example, electrons in the optical guiding region having energy $E_1$ would not be confined. The probability that these electrons would be transmitted from the optical guiding region 10 in to the p-type cladding layer 11 would be unity, and these electrons would be lost. In the present invention, however, Γ-electrons having an energy of $E_1$ face a potential barrier of 0.526 eV, as a result of the AlP layer 12. Approximately 87% of Γ-electrons at energy $E_1$ will be reflected back into the waveguide region 10 by the AlP layer 12, and only 13% of the electrons will escape from the optical guiding region 10 into the p-type cladding region 11. This improved confinement will improve the efficiency and high temperature operation of the laser diode.

Figure 10:
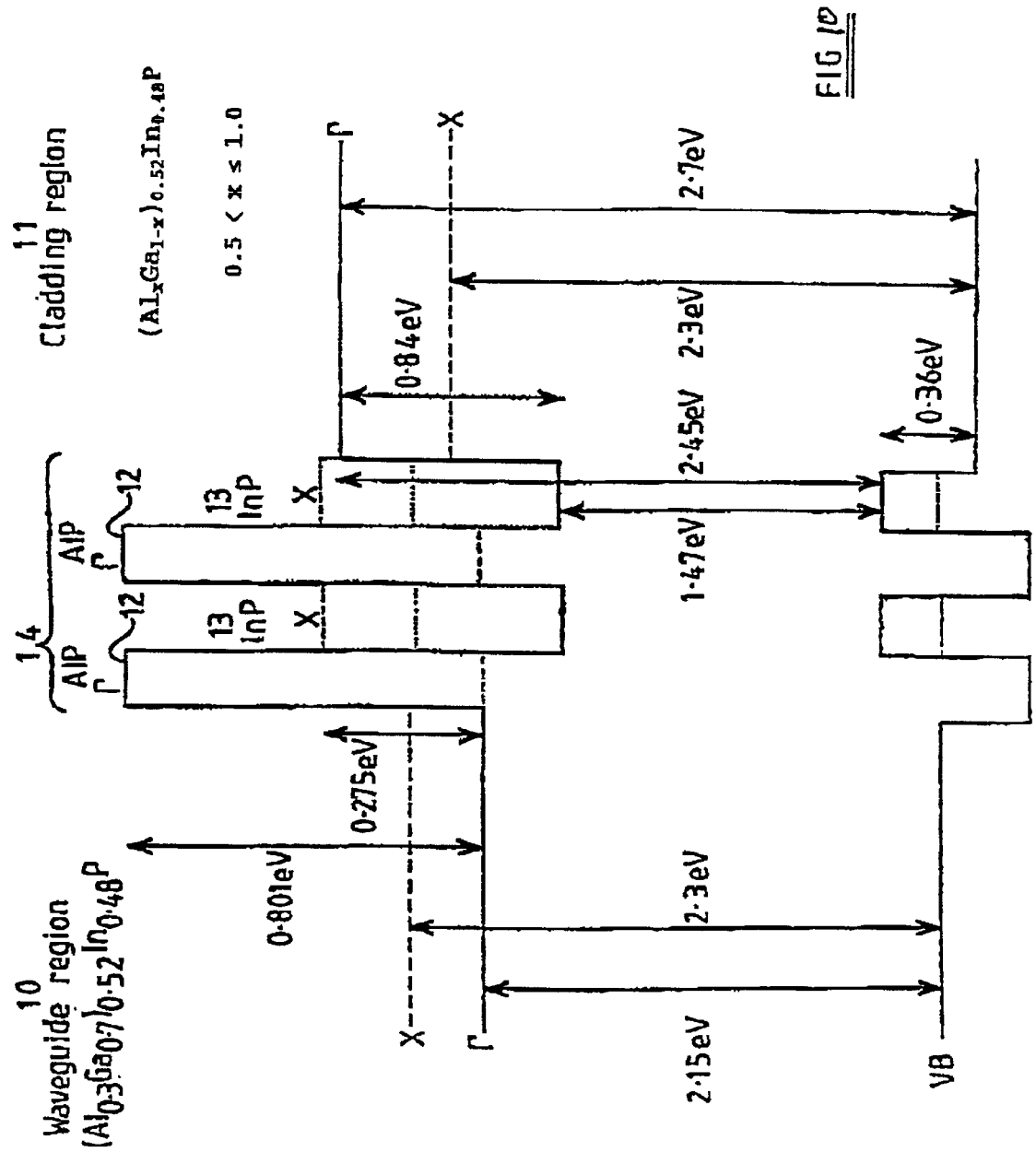
FIG. 10 shows the partial schematic band structure of another embodiment of the invention.

A further advantage of the invention is that the barrier layer 14 is strain compensated, since it is formed of one layer that is under tensile strain and one layer that is under compressive strain. Since the barrier layer 14 is strain compensated, it is possible to provide two or more barrier layers so as to further improve the confinement of electrons in the optical guiding region 10. It would also be possible to provide an AlP/InP superlattice barrier layer. FIG. 10 shows a modification of the embodiment of FIG. 5, in which the barrier layer 14 is formed of two AlP layers 12 and two InP layers 13, and FIG. 11 shows another modification of FIG. 5 in which the barrier layer 14 is a superlattice of four AlP layers 12 and four InP layers 13.

There is a further possible advantage of using a strain-compensated barrier layer 14. As noted above, a strained layer has a critical thickness above which misfit dislocations will occur. It has been reported, however, that a strain compensated barrier layer can be made thickness than the sum of the critical thicknesses of each individual layer without introducing defects into the layers. That is, it may be possible to grow a strain compensated AlP/InP barrier layer that is thicker than the combination of the critical thickness of AlP and the critical thickness of InP, without causing dislocations to form. If a thicker electron-reflecting barrier can be grown without introducing defects, it will reflect more electrons back into the optical guiding region, and thus improve confinement of the electrons.

Figure 6:
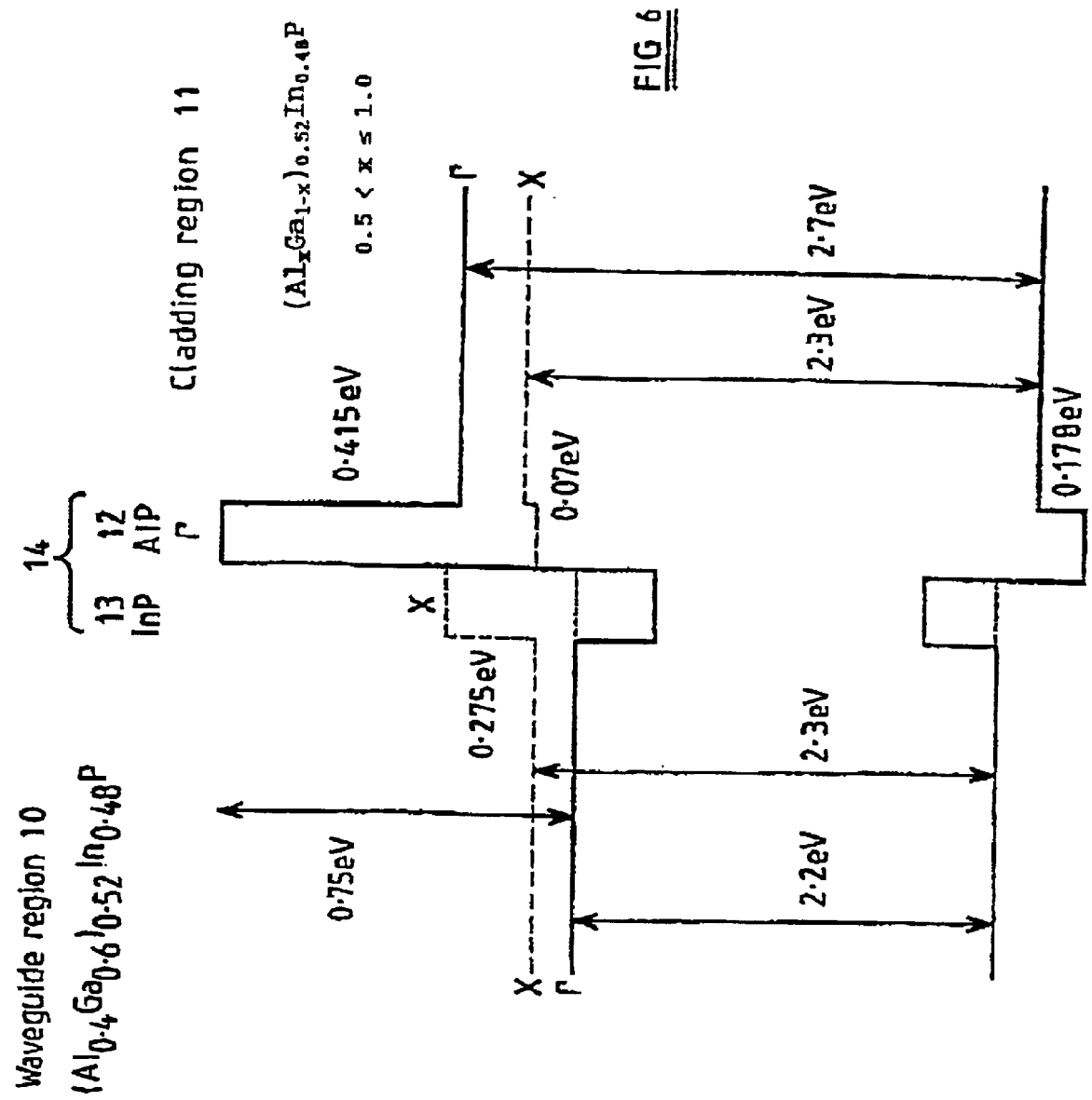
FIG. 6 illustrates the band structure of a modification of the embodiment of FIG. 5.

A further embodiment of the invention is illustrated in FIG. 6. This is generally similar to the embodiment of FIG. 5, except that the InP layer 14 is located between the optical guiding region 10 and the AlP layer 12. As in the embodiment of FIGS. 4 and 5, the band energies shown in FIG. 6 are for an $Al_{0.52}In_{0.48}P$ p-type cladding layer, although in principle the p-type cladding layer could be $(Al_xGa_{1-x})_{0.52}In_{0.48}P$ with $0.5<x\leq1.0$. The active region and n-type cladding region are not shown in FIG. 6.

In this embodiment, the InP layer 13 is made sufficiently thin so that the first confined state is located at the top of the potential well formed in the Γ-band.

In this embodiment, X-electrons in the optical waveguiding region 10 face a 0.275 eV potential barrier presented by the InP layer. As noted above in connection with FIG. 9, only around 6% of X-electrons will be transmitted through such a barrier. In consequence, the possible formation of a quantum well for X-electrons in the AlP layer 12 is less important. There is thus no need to select the composition of the optical guiding region 10 such that its Γ-band is degenerate with the X-band in the AlP layer 12. This provides a greater freedom in designing the structure of the LD. In particular, the aluminum content of the optical guiding region 10 can be increased, up to an x value of approximately 0.5.

In the embodiment illustrated in FIG. 6, the optical guiding region 10 is formed of $(Al_{0.4}Ga_{0.5})_{0.52}In_{0.48}P$. In consequence, the potential barrier for Γ-electrons is 0.75 eV.

A further advantage of the embodiment of FIG. 6 is that there is no quantum well on the p-doped cladding region side of the barrier layer 14 that is likely to trap holes. Holes that are injected over the potential barrier presented by the AlP layer 12 are likely to "overshoot" the quantum well formed by the InP layer 13 and enter the optical guiding region 10.

Figure 7:
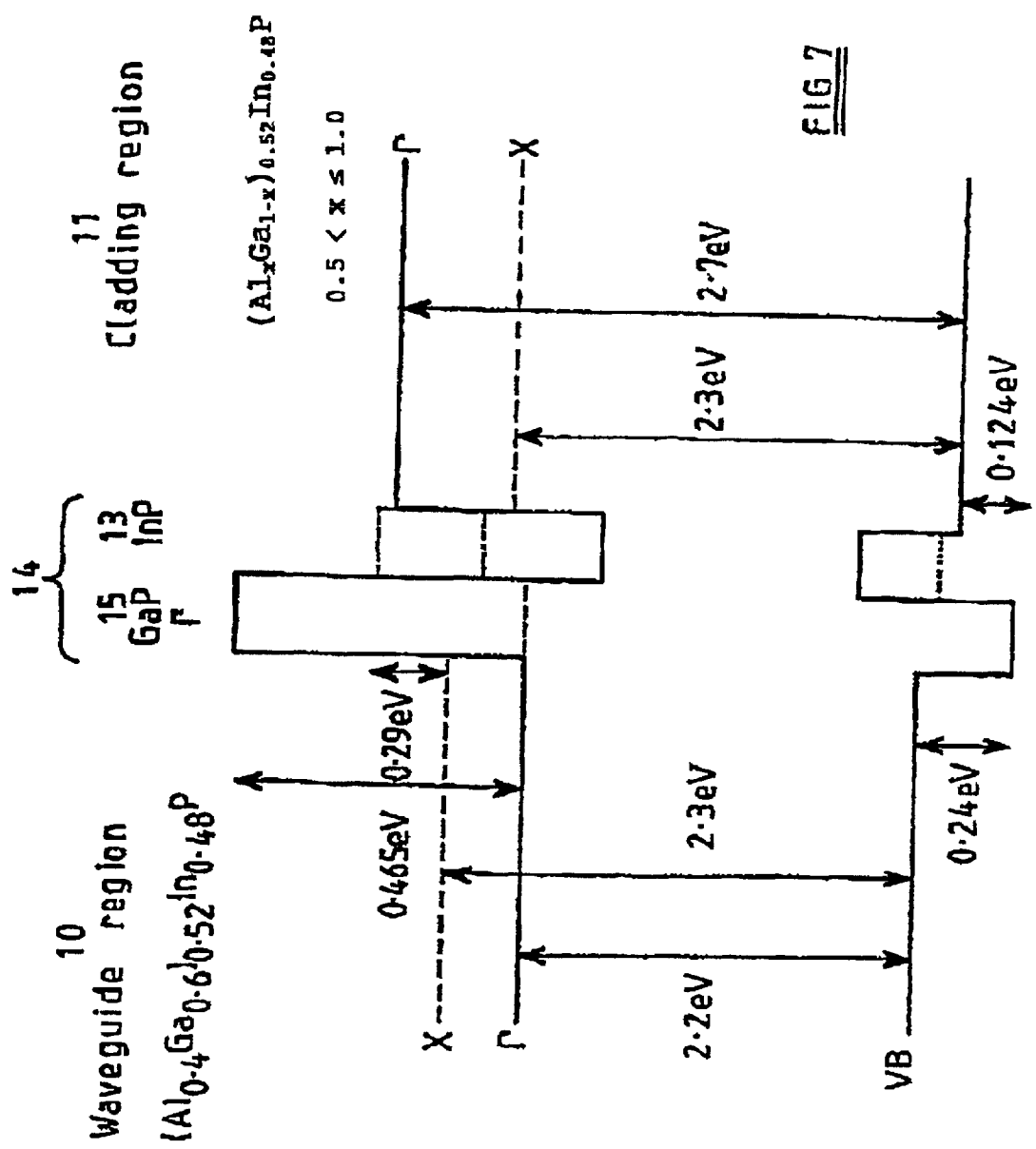
FIG. 7 illustrates the schematic band structure diagram of a further modification of FIG. 5.

A further embodiment of the invention is shown in FIG. 7. This is generally similar to the embodiment of FIG. 5, except that the AlP layer 12 of FIG. 5 is replaced by a GaP layer 15. The barrier layer 14 in this embodiment is formed of the GaP layer 15 and an InP layer 13. The band energies shown in FIG. 7 are for an $Al_{0.52}In_{0.42}P$ p-type cladding region 11. In principle, however, the p-type cladding region can be formed of $(Al_xGa_{1-x})_{0.52}In_{0.48}P$ layer where $0.5 < x \leq 1.0$. The active region and the n-type cladding region are not shown in FIG. 7.

Bulk GaP has a Γ-Γ bandgap of 2.9 eV and a Γ-X bandgap of 2.3 eV. GaP has a lattice constant of 5.451 eV, giving a lattice mismatch of around 3.7% compared to GaAs. Thus, the GaP layer 15 in FIG. 8 will be in a state of tensile strain. This tensile strain will reduce the Γ-Γ bandgap of the GaP layer 15 below the value for bulk GaP, but will increase the Γ-X bandgap.

As with the previous embodiments, the thickness of the GaP layer 15 must be lower than the critical thickness at which misfit dislocations occur. This critical thickness will again be around 16Å.

An advantage of the use of GaP in place of AlP is that holes in the valence band face a lower potential barrier. FIG. 7 shows that the potential barrier for holes is 0.124 eV, compared to 0.178 eV in FIGS. 5 and 6. The hole transmission probability for a 0.124 eV barrier having a thickness of 16Å is around 33%.

One possible disadvantage of the structure of FIG. 7 is that the potential barrier for Γ-electrons in the optical guiding region 10 is lower than in FIG. 5. As shown in FIG. 7, if a GaP layer is used, the potential barrier for a Γ-electron is 0.465 eV, as compared to 0.801 eV for an AlP layer. A 0.465 eV potential barrier having a thickness of 16Å gives a transmission probability of around 11%, assuming an effective mass $m_0 = 0.15$. As noted above, however, the probability of a Γ-electron being transmitted into the p-doped cladding region is probably significantly less than this calculated value, since there is a thick (AlGa)InP layer, with a Γ-Γ bandgap of up to 2.7 eV adjacent to the barrier layer 14.

An electron in the waveguide region 10 whose energy is degenerate with the Γ-band of the cladding region 11 has a probability of approximately 18% of passing through the barrier layer 14 into the cladding region 11.

In this embodiment, it is preferable to select the aluminium composition of the optical guiding region 10 such that its Γ-band is degenerate with the X-band in the GaP layer, to prevent formation of a quantum well for trapping X-electrons. In the embodiment of FIG. 7, this is done by choosing the aluminium mole fraction, x, of the optical guiding region 10 to be x=0.4.

Figure 8:
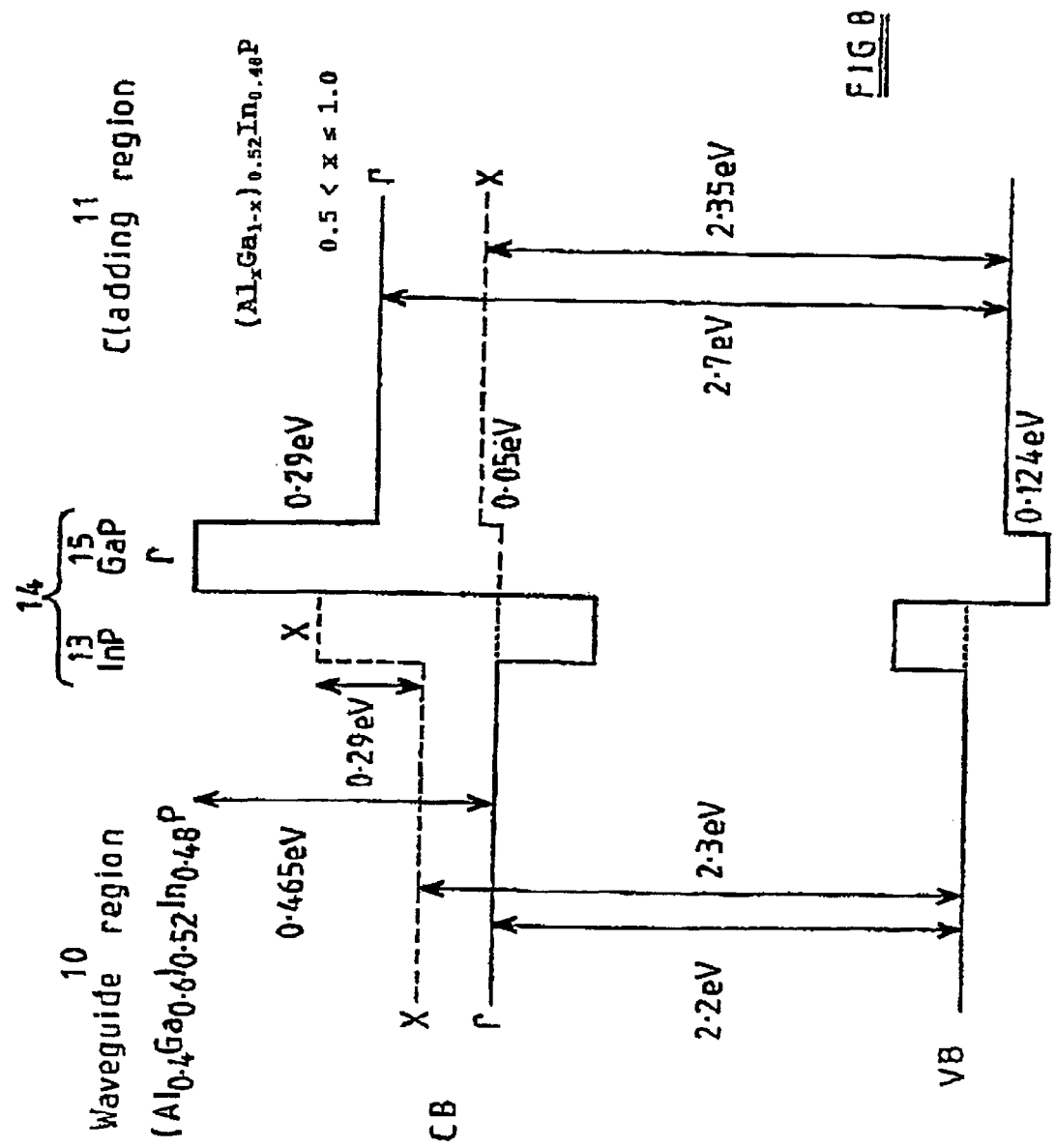
FIG. 8 shows the schematic band structure of a modification of FIG. 6.

A further embodiment of the invention is illustrated in FIG. 8. This is similar to that of FIG. 7, but the InP layer 13 is placed between the GaP layer 15 and the optical guiding region 10. Thus, this embodiment corresponds to the embodiment of FIG. 6, but with the AlP layer 12 of FIG. 6 replaced by a GaP layer 15. The band energies shown in FIG. 7 are for an $Al_{0.52}In_{0.48}P$ p-type cladding region 11. In principle, however, the p-type cladding region can be formed of an $(Al_xGa_{1-x})_{0.52}In_{0.48}P$ layer where $0.5 < x \leq 1.0$. The active region and the n-type cladding region are not shown in FIG. 8.

For the reasons described above with reference to FIG. 6, it is not necessary for the Γ-band in the optical guiding region 10 to be degenerate with the X-band in the GaP layer 15. This means that the aluminum concentration of the optical guiding region can be chosen more freely than the aluminum concentration of the optical guiding region 10 in the embodiment of FIG. 7. In the embodiment of FIG. 8, the optical guiding region is formed of $(Al_{0.4}Ga_{0.6})_{0.52}In\ 0.48P$. For an optical guiding region 10 having this composition, most of the electrons will be located in the Γ-band, and will face a 0.465 eV potential barrier against transmission into the p-doped cladding region 11. X-electrons in the optical guiding region 10 will face a 0.29 eV potential barrier, owing to the presence of the InP layer. The potential barrier in the valence band to hole injection is 0.124 eV. As in the embodiment of FIG. 6, holes that overcome the potential barrier formed by the GaP layer 15 are likely to be swept into the waveguide region 10, and will thus "overshoot" the quantum well in the valence band formed by the InP layer 13.

In the embodiments described above, the electron reflecting layers 12, 13 and 15 are undoped. It is, however, possible for these layers to be heavily p-doped. Doping the electron reflecting layers will cause band bending, and this band bending will increase the height of the potential barrier to electron transport from the optical guiding region 10 to the p-type cladding region 11. Doping the barrier layers p-type will also reduce the barrier height for hole transport into the optical guiding region.

Figure 1:
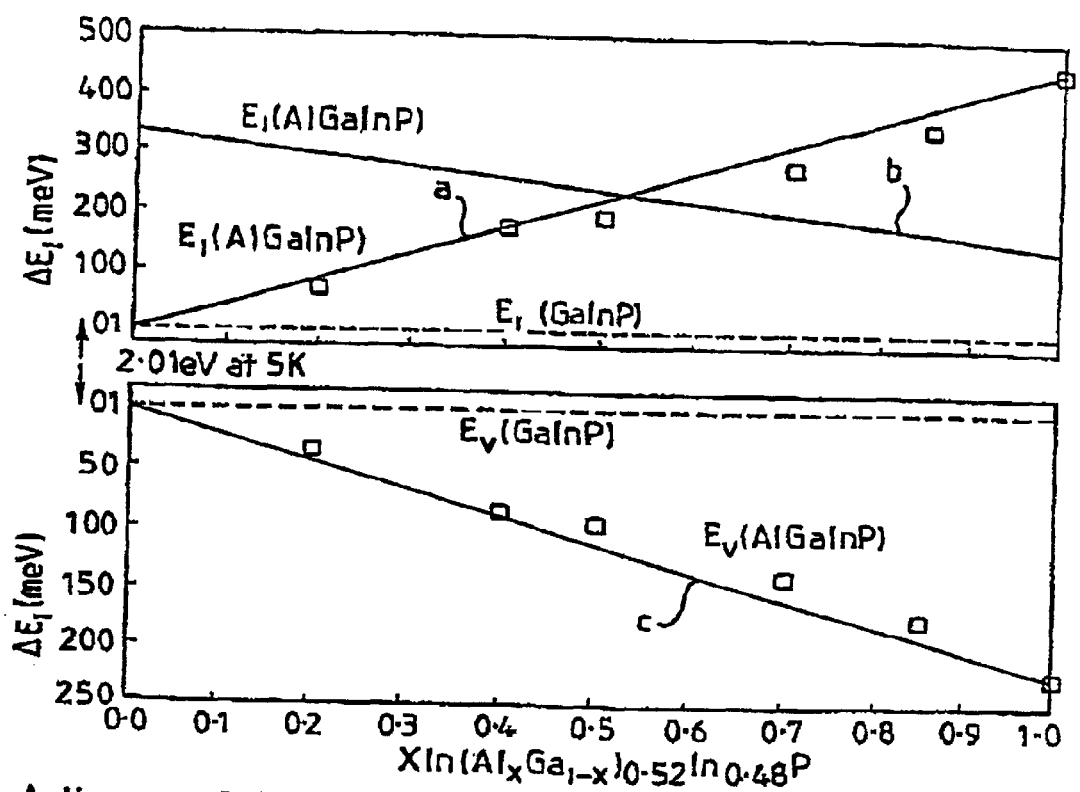
FIG. 1 shows the variation in the (Ga,In)P/(Al,Ga,In)P heterobarrier height as a function of the aluminium mole fraction of the quaternary alloy.

The present invention has been described with reference to the (Al,Ga,In)P alloy system. The present invention, however, is not limited to this particular alloy system. A person skilled in the art of semiconductor physics and electronic materials will readily appreciate that the present invention is applicable to any hetrostructure laser device whose constituents have a conduction band dependence similar to that shown in FIG. 1.

In the embodiments described above, the electron-reflecting layers 12, 13, 15 have been placed at the interface between the optical guiding region 10 and the p-doped cladding region 11. It is not, however, essential for the electron-reflecting layers to be placed exactly at the interface between the optical guiding region and the p-doped cladding region. In principle, the electron-reflecting layer(s) could be disposed within the optical guiding region 10, in the p-side of the optical guiding region. Moreover, the electron-reflecting barrier layer(s) could in principle, be placed within the p-doped cladding region, near the interface with the optical guiding region. This is, however, less preferable, since once electrons have passed into the p-doped cladding region electron loss can occur via the X-states in the cladding region even if there is a potential barrier in the Γ-band within the cladding region.

Although the invention has been described above with reference to SCH laser devices, the invention is not limited to an SCH laser device, but can be applied to other optical semiconductor devices. For example, it could be applied to other laser devices, such as a vertical cavity laser device, or to a light-emitting diode such as a resonant cavity LED.

INDUSTRIAL APPLICABILITY

According to the present invention as set forth above, the present invention provides a barrier that will prevent leakage of both Γ-electrons and X-electrons. The problem of carrier loss via the X-states in the p-doped cladding region is prevented, or at least significantly reduced, since the electron-reflecting barrier reflects X-electrons as well as Γ-electrons.

According to the present invention as set forth above, the X-conduction band of the electron reflecting layer is chosen to be substantially degenerate with the Γ-conduction band of the optical guiding region. This prevents the formation of a quantum well for X-electrons in the layer for reflecting Γ-electrons. This can be done, for example, by selecting the composition of the optical waveguiding region appropriately.

What is claimed is:

1. An optical semiconductor device comprising:
   an active region; and
   a p-doped cladding region disposed on one side of the active region;
   wherein an electron-reflecting barrier is provided between the cladding region and the active region for reflecting both Γ-electrons and X-electrons, the electron-reflecting barrier providing a greater potential barrier to Γ-electrons than the p-doped cladding region,
   wherein the electron-reflecting barrier comprises a first electron-reflecting layer for reflecting Γ-electrons and a second electron-reflecting layer for reflecting X-electrons.

2. A device according to claim 1, wherein at least one of the electron-reflecting layers is a strained layer.

3. A device according to claim 2, wherein one of the electron-reflecting layers is in a state of compressive strain and the other of the electron-reflecting layers is in a state tensile strain.

4. A device according to claim 1, wherein the device is a light-emitting diode.

5. A device according to claim 1, wherein the device is a laser device.

6. A device according to claim 5, wherein the device is a separate confinement heterostructure laser device comprising an optical guiding region, the active region being disposed within the optical guiding region.

7. A device according to claim 1, wherein the layer for reflecting Γ-electrons is disposed between the optical guiding region and the layer for reflecting x-electrons.

8. A device according to claim 7, wherein the Γ-conduction band of the optical guiding region is substantially degenerate with the x-conduction band of the layer for reflecting Γ-electrons.

9. A device according to claim 1, wherein the layer for reflecting Γ-electrons is disposed between the layer for reflecting x-electrons and the p-doped cladding region.

10. A device according to claim 1, wherein the electron-reflecting barrier comprises a plurality of first electron-reflecting layers for reflecting Γ-electrons and a plurality of second electron-reflecting layers for reflecting x-electrons.

11. A device according to claim 10, wherein the electron-reflecting barrier is a superlattice structure.

12. A device according to claim 1, wherein the device is fabricated in the (Al, Ga, In)P system, the layer for reflecting Γ-electrons is made from a material selected from the group consisting of AlP and GaP, and the layer for reflecting x-electrons is made from InP.

13. A device according to claim 10, wherein the device is fabricated in the (Al Ga, In)P system, each layer for reflecting Γ-electrons is made of a material selected from the group consisting of AlP and GaP, and the layer for reflecting x-electrons is made from InP.

14. A device according to claim 8, wherein the layer for reflecting Γ-electrons is AlP and the optical guiding region is $(Al_{0.3}Ga_{0.7})_{0.52}In_{0.48}P$.

15. A device according to claim 12, wherein the thickness of each of the electron-reflecting layers is 16Å or less.

16. A device according to claim 1, wherein at least one of the electron-reflecting layers is p-doped.

17. A device according to claim 12, wherein the first electron-reflecting layer contains indium.

18. A device according to claim 6, wherein the electron-reflecting barrier is disposed between the optical guiding region and the p-doped cladding region.

19. An optical semiconductor device comprising:
    an optical guiding region;
    an active region having at least one energy well, said active region being disposed in said optical guiding region; and
    n-doped and p-doped cladding regions disposed on opposite sides of the optical guiding region;
    wherein an electron-reflecting layer for reflecting Γ-electrons is provided between the p-doped cladding region and the active region; and
    wherein the electron-reflecting layer contacts with the optical guiding region so that the Γ-conduction band of the optical guiding region is substantially degenerate with the X-conduction band of the electron-reflecting layer, and
    the electron-reflecting layer is formed of AlP.

20. A device according to claim 19, wherein the optical guiding region is formed of $(Al_{0.5}Ga_{0.7})_{0.52}In_{0.48}P$.

21. A device according to claim 19, wherein the electron-reflecting layer is p-doped.

22. A device according to claim 19, wherein the electron-reflecting layer is disposed between the optical guiding region and the p-doped cladding region.

23. A device according to claim 19, wherein the device is a separate confinement heterostructure laser device.

* * * * *